United States Patent [19]

Miller et al.

[11] 3,993,990

[45] Nov. 23, 1976

[54] METHOD OF AND APPARATUS FOR ENHANCING DISCHARGE STATE MANIPULATION OF MULTICELLED GAS DISCHARGE DISPLAY/MEMORY DEVICES

[75] Inventors: John W. V. Miller, Toledo; William D. Petty, Perrysburg, both of Ohio

[73] Assignee: Owens-Illinois, Inc., Toledo, Ohio

[22] Filed: Feb. 3, 1975

[21] Appl. No.: 546,241

[52] U.S. Cl. .................. 340/324 M; 315/169 TV; 340/343
[51] Int. Cl.² .......................................... G06F 3/14
[58] Field of Search ........... 340/324 R, 324 M, 343, 340/173 PL; 315/169 TV, 169 R

[56] References Cited
UNITED STATES PATENTS

| | | | |
|---|---|---|---|
| 3,786,484 | 1/1974 | Miavecz | 340/324 M |
| 3,824,580 | 7/1974 | Bringol | 340/324 M |
| 3,877,006 | 4/1975 | Reboul | 340/324 M |

Primary Examiner—Marshall M. Curtis
Attorney, Agent, or Firm—Donald Keith Wedding

[57] ABSTRACT

Multicelled gas discharge display/memory device addressing is enhanced by altering the sustainer voltage waveform during addressing to provide longer intervals for the transfer of addressed cells between an "on state" and an "off state" of discharge. Sustainer waveforms allow more time for "turn on" and "turn off" partial select signals to be effective by extending the sustainer waveform pedestals on which the partial selects are imposed. These sustainer alterations can be performed by extending the sustainer periods in which addressing is performed or by maintaining the sustainer periods and shortening those portions of the period which are not utilized for addressing as by employing only a "write" pedestal or only an "erase" pedestal.

35 Claims, 7 Drawing Figures

METHOD OF AND APPARATUS FOR ENHANCING DISCHARGE STATE MANIPULATION OF MULTICELLED GAS DISCHARGE DISPLAY/MEMORY DEVICES

BACKGROUND OF THE INVENTION

1. Field of the Invention

This invention relates to multicelled gas discharge display/memory devices and more particularly to methods of and apparatus for operating such devices with preferred waveforms for addressng and sustaining functions which tend to optimize the performance of the devices.

2. Description of the Prior Art

Multicelled gas discharge devices as display and/or memory units have been proposed in the form of a pair of opposed dielectric charge storage members which are backed by electrodes, the electrodes being so formed and oriented with respect to an ionizable gaseous medium as to define a plurality of discrete gas discharge cells. Charged particles (electrons and ions) produced upon ionization of the gas volume of a selected discharge cell, when proper alternating operating voltages are applied between opposed electrodes, are collected upon the surface of the dielectric at specifically defined locations and constitute an electrical field opposing the electrical field which created them. Those collected charges aid an applied voltage of the polarity opposite that which created them so that they aid in the initiation of another discharge by imposing a total voltage across the gas sufficient to again initiate a discharge and a collection of charges. This repetitive and alternating charge collection and ionization discharge constitutes an electrical memory of a cell in the on state of discharge. With properly chosen values of the alternating voltage, cells in the off state of discharge remain in that state during the alternations hence that state is also retained in electrical memory.

The alternating voltage offering the above memory characteristics is termed a sustaining voltage. For a given device it usually has a range of values.

Change of the state of individual cells in a device subject to a sustaining voltage has been accomplished by superimposing voltage pulses on the sustaining voltage. Cells in an off state of discharge have been turned on by pulses, usually applied to the opposed electrodes of the selected cell, which raise the voltage imposed across the gas to a level which initiates an ionization discharge of a magnitude to cause sufficient charged particles to collect on the dielectric surface of the cell to cause a repetition of the discharge by virtue of the augmentation of the reversed sustainer voltage with the wall charge voltage. Cells in the on state of discharge are selectively manipulated to the off state by applying a voltage pulse across the selected cell in opposition to the currently applied sustainer and of a magnitude sufficient to discharge the wall charge without developing an opposite wall charge at the on state level. In each of a turn on discharge and a turn off discharge a burst of light is emitted over a very short portion of the sustainer half period. For example, where the sustainer is applied at a typical 50 kilohertz the light burst of on state cells may be of about 500 nanoseconds in the initial transition portion of each ten microsecond half cycle were essentially a square waveform is imposed.

Sustainer voltage waveforms having regular periods are conventionally developed in various forms. One typical prior art form involved an essentially square wave developed from two components by applying a sustainer voltage level $V_s$ to one array of electrodes of a pair of opposed arrays making up the matrix of cells of the device for an interval which is less than half a period. An addressing pedestal was then imposed for an interval which typically could extend up to the balance of the half period at a level intermediate the sustainer voltage $V_s$ and the reference voltage level. During the second half of the sustainer period the first sustainer component remains at its reference level and the second sustainer component shifts from its reference level to $V_s$ for a suitable interval after which it shifts to a pedestal of a suitable addressing level. The first and second components, if considered as $x$ and $y$ components in a cell matrix made up of an $x$ array of electrodes transversely oriented to a $y$ array of electrodes, imposes a composite sustainer waveform, $x-y$, which typically is made up of a step from the reference level to positive $V_s$, a step from positive $V_s$ to $V_M$ and a step from $V_M$ to the reference level $V_N$ for the first half period, then a step to negative $V_s$, a step from negative $V_s$ to $V_M$ negative, and a step from $V_M$ to the reference level $V_N$ for the second half period.

During the transitions to the $V_s$ levels, cells in the on state of discharge are discharged. The displacement of charged particles in the ionized gas of the cells and the accumulation of those particles to develop a neutralizing wall voltage on the dielectric separating the gas from the electrode or electrodes of the cell requires a time interval which imposes a lower limit on the interval $V_s$ is imposed. A further time limit is imposed for cell manipulation. Thus, where a cell is addressed for writing by application of a write signal a sufficient interval is allowed prior to a transition to the opposite polarity of $V_s$ for the discharge of the cell from an off state to an on state to stabilize its wall voltage at or near the neutralizing level of an on state cell. When a cell is erased, its transfer to the off state from the on state is by application of an erase signal which discharges it from its on state wall charge to a wall voltage at or near its "neutral" wall voltage whereby subsequent sustainer transitions are not augmented by any residual wall voltage sufficiently to ignite a further discharge, again requiring a given amount of time prior to further transitions. These time intervals have been found to be dependent on a number of physical parameters of the cells and thus of the devices made up of a matrix of cells including gas volume thickness, dielectric interlayer thickness, gas composition and pressure and applied operating potentials. While a range of operating parameters are operative, these parameters are chosen to place the widest range of cell dimensions within the operative range whereby an acceptable yield of multicelled devices is achieved. Further, the cycle waveform and period has been regular and has been chosen as a compromise to realize commercially acceptable device yields where all cells are operative for manipulation of their discharge states when addressed. Such traditional regular waveforms limit device performance by not optimally using the time available and by forcing compromises on operating tolerances, current requirements and brightness and contrast levels.

An object of the present invention is to optimize the dynamic waveforms applied to multicelled gas dischare display/memory devices.

Another object is to enhance operating margins for multicelled gas discharge display/memory devices.

A further object is to improve device performance and yield for multicelled gas discharge display/memory devices. More particularly objects involve achieving satisfactory operation with slower gas mixtures whereby brightness of discharge displays is increased, and lower currents and thus reduced dielectric thicknesses are tolerable. Additional performance improvements include reduction in the static firing voltage of cells and increase in the tolerable geometric non-uniformities of discharge devices.

A fifth object is to achieve more reliable operation of multicelled gas discharge display/memory devices with respect to the selective manipulation of the charge state of individual cells.

SUMMARY OF THE INVENTION

The aforenoted objects are realized in accordance with one embodiment of this invention by applying waveforms across the electrodes of cells which are extended during the addressing of the cells as by extending the interval of the addressing pedestals. It has been found that the erase window increases dramatically as the interval between an erase pulse and the start of the next sustainer pulse is increased. A wider write pedestal interval and a wider write pulse interval lowers the required pulse voltage and increases the write pulse response uniformity from cell to cell within the multicelled device. This has permitted the use of devices having greater geometric non-uniformities in applications requiring electrical uniformity.

In one system the period of the sustainer waveform is retained while the proportions of the intervals are altered to provide the extended addressing pedetals. For example, in the case of a device subjected to a 50 kilohertz sustainer and requiring about 5 microseconds dwell at or above the sustainer voltage at which "on" cells are discharged, the proportions of the period are altered for writing such that the 20 microsecond period is divided into essentially 5 microsecond dwells for the positive and negative sustainer voltage levels and an intervening 10 microsecond pedestal upon which partial selects further deviating from the neutral of the sustainer waveform are applied in the direction of displacement of that pedestal from neutral. An erase pedestal is effectively eliminated or reduced in length in the period in which write signals are applied. Conversely, when cells are to be erased, the write pedestal is effectively eliminated or reduced in length and an extended erase pedestal of about 10 microseconds duration is placed between the sustainer voltage dwell levels.

In the case of a write function, advantage is taken of the wider address pedestal by applying a write pulse of a lower voltage than required previously for a given cell. This pulse is applied for a longer interval with increased reliability. For example, the write pulse may be about 210 volts above the sustainer wavefrom neutral level and can be imposed for about 5 microseconds with enhanced reliability of writing over a conventional write pulse of about 2.5 microseconds duration and about 340 volts above the sustainer waveform neutral.

Erase signals of about 2.5 microseconds duration are effective to transfer an on state cell to an off state over a significantly wider pulse voltage value when the interval from the termination of the signal pulse to the next sustainer voltage major transition is increased. For example, one cell geometry enlarged its erase window from an erase pulse magnitude range of from about 63 volts to about 109 volts at a sustainer voltage of 116 volts and an erase magnitude of about 82 volts at a sustainer voltage of 125 volts when the interval between the end of the erase pulse and the next sustainer transition is 2.5 microseconds to an erase pulse magnitude range of about from 54 volts to about 159 volts at a sustainer voltage of 116 volts, a range of about 64 volts to about 91 volts at a sustainer voltage of 125 and a range of about 86 to about 90 volts at a sustainer voltage of about 132 volts when the interval between the end of the erase pulse and the next major sustainer transition is 5.625 microseconds. The wider range of tolerances at the greater intervals indicate that a device with greater geometric non-uniformities between its cells will have acceptable electrical uniformity between those cells.

DESCRIPTION OF THE PREFERRED EMOBIDMENTS

Figure 1:
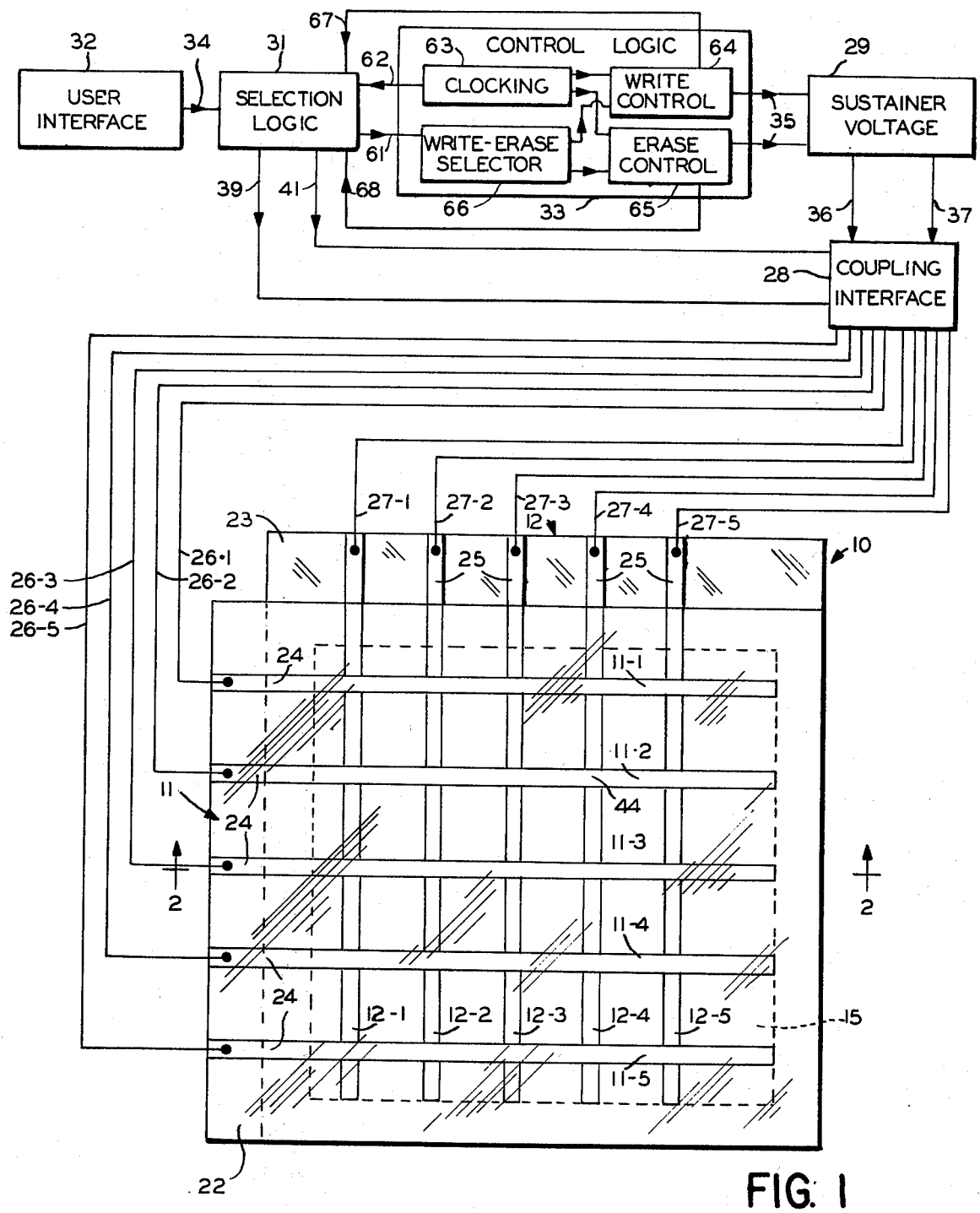
FIG. 1 is a diagrammatic representation of a display panel having a cell matrix of 5 by 5 cells and including a block diagram of the controls for the panel and its connection to the user's interfacing circuitry wherein control logic defines the sustainer pedestal interval extensions and the cell discharge state manipulation signal intervals of this invention.
Figure 2:
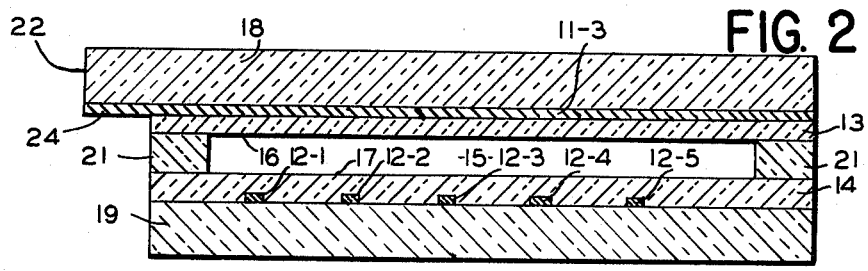
FIG. 2 is a cross-sectional view (enlarged, but not to proportional scale since the thickness of the gas volume, dielectric members and conductor arrays have been enlarged for purposes of illustration) taken on lines 2—2 of FIG. 1.

An exemplary form of multicelled gas discharge display/memory device 10 is shown in FIGS. 1 and 2 as made up of opposed electrode arrays 11 and 12 having dielectric layers 13 and 14 overcoating the electrodes and separating them from a gaseous medium 15 enclosed in the space between the proximate surfaces 16 and 17 of the layers 13 and 14. When the physical characteristics and operating parameters are properly chosen, a panel assembly 10 can provide a display in the form of lighted and darkened localized areas in patterns which provide visual displays of images either as lighted images on a darker background or darker images on a lighted background.

As shown in FIG. 2 the arrays 12 and 13 can be formed in situ on dielectric backing members 18 and 19, advantageously glass plates where transparency for visual display of discharges is desired, typically about one-eighth to one-fourth inch thick. The electrodes 12 and 13 can be individual conductive strips having a resistance of less than 3000 ohms per inch and preferably about 50 ohms per inch and can be in the form of parallel straight conductors typically 3 mils wide spaced about 17 mils on centers. The conductor strips are, for example, about 8000 angstroms thick, and may be transparent, semi-transparent, or opaque conductive material such as tin oxide, gold or aluminum. Dielectric overlays are formed on the plate supported conductors as layers 13 and 14 about 1 mil thick. The gas volume 15 is thin, usually under 10 mils and typically about 4 to 6 mils in thickness. It is of a nature to produce a copious supply of charged particles (ions and electrons). These charges are alternately collectable on the surfaces 16 and 17 of dielectric layers 13 and 14 at opposed or facing elemental or discrete areas defined by the conductor arrays on the non-gas contacting sides of the layers. Many gases can be employed in volume 15. One form of display panel has a neon-krypton or neon-argon atmosphere with neon about 99.7 percent by weight and maintained at about atmospheric pressure.

Planar panels 10 are made up by forming electrode arrays on their respective backing members, overcoating the arrays with dielectric and mounting the dielectric overcoats in face to face relation with a dielectric spacer 21 bonded to the respective dielectric layers 13 and 14. A tubulation (not shown) is provided into the volume 15 to enable the atmosphere to be introduced.

The panel 10 is arranged with backing member extensions 22 and 23 which extend beyond the opposed backing member to provide support for and access to terminal portions 24 and 25 for the electrodes 11 and 12 respectively. In order to facilitate the connection of external circuits, portions 24 and 25 are free of dielectric overcoats and leads 26 and 27 are connected to respective terminal portions for the x and y electrode arrays.

Operating signals are applied over leads 26 and 27 through a coupling interface 28 wich can comprise pulsers (not shown) for superimposing signals on a periodic pulsating sustainer voltage from source 29 in response to signals from a decoder 31. Generally information from the user's equipment such as a computer or data terminal (not shown) is passed by interface circuitry 32 and decoded by selection logic 31 for the cell manipulations required in the display/memory functions of panel 10. Synchronization of the decoded signals with the sustainer voltage is by means of control logic 33 which provides the clocking of the sustainer.

In normal operation of the panel, information from the user interface 32 is passed to selection logic 31 over path 34 while the control logic 33 regularly clocks the sustainer voltage 29 over paths 35 to impose a sustainer voltage component on the x axis of the panel 10 on path 36, and on the y axis, on path 37. Selection logic is timed with respect to the sustainer clocking from control logic 33 over path 62 so that manipulating signals are controlled for the cells corresponding to the information decoded in 31 by signals passed on path 39 for the x coordinate and on path 41 for the y coordinate of each selected cell.

For convenience the cells have been designated by their electrodes which, in turn, are designated by suffix numbers separated from the general reference character for the electrodes as 11-1, 11-2 . . . 11-n for the x array electrodes and 12-1, 12-2 . . . 12-n for the y array electrodes.

The discrete areas of panel 10 comprising individual discharge cells emit radiant energy, conveniently visible light and hereafter termed "light", as a result of gaseous discharges produced when a voltage exceeding that necessary to ionize the gas is imposed between the electrodes of cross points 44. Such cells are defined as the shadow area between the electrodes 11 and 12 of the opposed electrode arrays when viewed along a common perpendicular to each of the arrays and the light is visible from the exterior of the panel assembly for those cross points or cells through a translucent structure which can include one electrode and/or a fringe area around one electrode. A discharge is maintained and thus stored, once it is initiated in a cell, by causing charged particles in the gas (electrons and ions) to be attracted to the opposed dielectric surfaces 16 and 17 overlying the electrode subject to a potential opposite that of the particle change. A dielectric surface over but one electrode of each cell will also provide a charge collection surface. These charges build up a wall potential opposing and tending to neutralize that applied to the electrodes and by the neutralization tend to terminate the discharge and light emitted as a result of the discharge. Reversel of the potential applied to the electrode arrays, when at a given level determined by the device parameters, applies a potential across the cell opposite that which caused the previous discharge which is of a magnitude which, if augmented by a wall voltage, reignites the discharge to again cause a burst of light and collection of charged particles on the dielectric surfaces 16 and 17. By regular reversal of this applied potential the discharge is caused to repeat itself and thereby to be sustained as a memory or stored signal.

Figure 3:
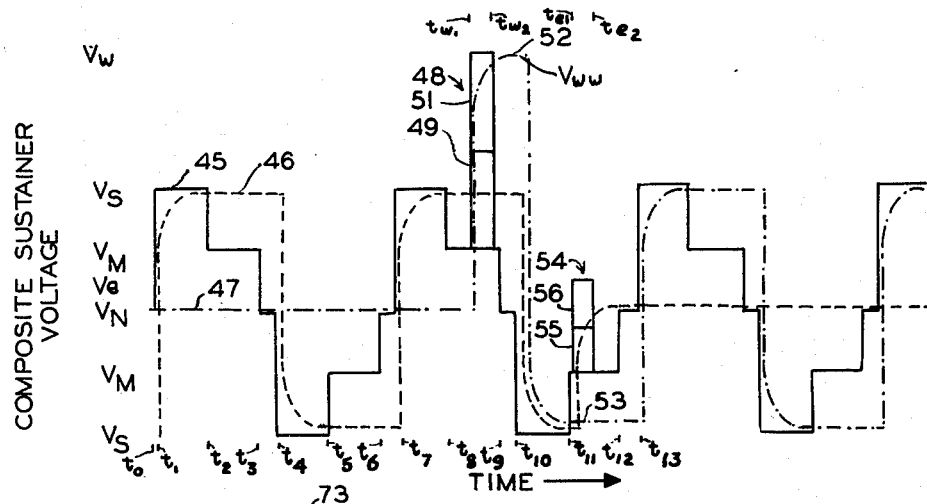
FIG. 3 is a typical prior art plot against time of a sustaining voltage waveform with cell addressing write and erase signals and the cell wall charge voltages resulting from such signals.

A general form of sustainer with an erase and write addressing signal is shown in FIG. 3 to illustrate typical prior art operation of multicelled gas discharge devices, typically a panel 10. The sustainer waveform is generated by applying voltage pulses to the opposed electrode arrays 11 and 12 as sustainer waveform components which are shifted in phase with respect to each other so that where electrodes of array 11 are the x coordinates and those of the arrays 12 are the y coordinates the corresponding applied x and y voltages from a composite waveform 45 of (x–4). Each sustainer component has been generated by periodically coupling voltages to a buss connected in parallel to the electrodes of its respective array through normally open switches. Such switches can be transistors where the desired voltage is connected to the buss through the emitter-collector circuit and the transistor is switched between a cut-off condition and saturation by signals applied to its base. Typically, a high voltage $V_s$ for the maximum sustainer deviations, a medium voltage $V_M$ for the addressing pedestals, and a ground $V_N$ are selectively coupled to the sustainer buss with rapid turn-on and turn-off transistor switches of the type disclosed in the co-pending application for U.S. Pat. Ser. No. 313,348 filed Dec. 8, 1972, entitled "Transistor Control Apparatus" by Edwin F. Peters (Case P-12693).

A typical sustainer can be operated at 50 kilohertz with a $V_s$ of 120 volts a $V_M$ of about 60 volts and $V_N$ at external ground. Thus, as shown in FIG. 3, a cycle of the sustainer 45 is made up of a transition from the neutral level $N_N$ to $V_s$, interval $t_0$ to $t_1$, maintenance of the $V_s$ level for about 5 microseconds, $t_1$ to $t_2$ of the 20 microsecond cycle period, a transition to $V_M$ at $t_2$ for about 5 microseconds, until 3, and a brief transition to $V_N$, to reduce panel displacement current to a more tolerable level, followed by a similar half cycle of the opposite polarity extending to between times $t_4$ and $t_7$. This plot is idealized for convenience in discussion. It is to be recognized that the square waveforms have discrete rise and fall times and some rounding occurs at their break points. Furthermore, operation does not rely upon the use of sharp waveforms and might even function with sine waves or curved waves which are not flat topped. Thus in the following discussion pulse widths or intervals of pulse duration refer to the interval the effective value of the pulse is at or above the critical voltage such as $V_s$ for a sustainer or $V_e$ or $V_w$ for an erase or write pulse.

Wall charge voltages are illustrated for a cell in the on state of discharge at the beginning of the illustrated waveform as dashed line 46 and for a cell in the off state of discharge at that time by the dot-dashed line 47. The periodically applied sustainer waveform is below the potential which will fire a discharge in any cell of the matrix and is sufficient when augmented by a wall voltage of an on state cell to sustain a series of discharges on each transition of the sustainer voltage to an opposite extreme value. Thus, if it is assumed that an on state cell develops a wall voltage essentially at the value of the applied sustainer voltage, about 120 volts in the example, then upon the transition of the sustainer to a 120 volt level of opposite polarity, an effective 240 volts is applied across the cell to ionize its gas and cause it to discharge as at time $t_4$. The wall charge accumulates over a stabilizing interval represented by the knee of the wall voltage curve 46 and is retained until time $t_4$ when it discharges to the opposite polarity. It will be noted that the deviation, $V_s$, from the neutral voltage of off state cells is insuffficient to ignite a discharge in those cells.

Conventional manipulation of cells is also illustrated in FIG. 3 where in the second cycle, for convenience to be between times $t_6$ and $t_{12}$, an off state cell is written, transferred to an on state by the pulse 48 applied during the pedestal $V_M$ between $t_8$ and $t_9$, and an on state cell is erased, transferred to an off state by the pulse between $t_{11}$ and $t_{12}$. The write partial selects 48 are made up of a positive pulse 49 on the x coordinate of the cell and a negative pulse 51 on the y coordinate of the cell to impose a total voltage of about 250 volts from the $V_G$ level for about 2.5 microseconds between $t_{w1}$ and $t_{w2}$ across the gas of the cell to initiate a discharge and develop a wall voltage as shown at 52. It will be noted that the effective duration of the write pulse may be insufficient to permit the full pulse voltage to be neutralized and that the voltage may not rise to the level of the write pulse as represented at 52; however, the wall voltage of the selected cell will be raised sufficiently so that on the next major reversal of the sustainer at $t_{10}$ it augments that $V_s$ value sufficiently to initiate a regular discharge which produces wall voltages for that cell as shown at 53. Conversely, an on state cell having a wall voltage as at 46 is discharged to or near the neutral wall voltage by erase pulse 54 applied between times $t_{e1}$ and $t_{e2}$ made up of pulse 55 of a positive value on the x coordinate of the cell to be erased and pulse 56 of a negative value on the y coordinate of the cell applied during the negative address pedestal at $-V_M$ during interval $t_{11}$ to $t_{12}$ of the sustainer waveform.

The circuitry imposing the manipulating pulses has limitations in practical applications which do not provide the squared waveforms illustrated however these forms are convenient for illustrative purposes. In the past the manipulating signals have been imposed in a time position on the regular sustainer waveform such that the transitions in wall charge and the resultant wall voltage of the respective cell or cells is stabilized to a degree required for the result desired. That is, in the case of a write operation the cell wall voltage is raised sufficiently during the write pulse applied between times $t_8$ and $t_9$ that at time $t_{10}$, when the sustainer makes its negative excursion to a value $-V_s$, the write wall voltage $V_{ww}$ of the cell is sufficient such that $V_s + V_{ww}$ will cause another discharge in that cell. Accordingly, the write pulse is imposed for about 2.5 microseconds to allow for this charge accumulation and wall voltage development. An erase pulse requires stabilization of the charge transition to produce a wall voltage at or near neutral voltage of the sustainer so that the major transition of the sustainer to the opposite polarity does not appear to the cell as a continuation of the erase signal to a rewrite level and so that the cell wall voltage is so near neutral that the following sustainer transition is with respect to a stable wall charge near the neutral level and thus insufficient to institute a discharge. Erase pulses for the exemplary 50 kilohertz have therefore been of a relatively short, duration for example about 1.5 microsecond and spaced from the next major transition by about 2.5 microseconds in the interval $t_{11}$ to $t_{12}$ to assure stabilization near neutral before the next sustainer transition.

These regular sustainer waveforms and the constraints they impose on the operating sequences for addressing individual cells narrow the tolerances on the multicelled discharge devices since the cell in the matrix with the most unfavorable characteristics must be controlled by the waveforms.

Figure 7:
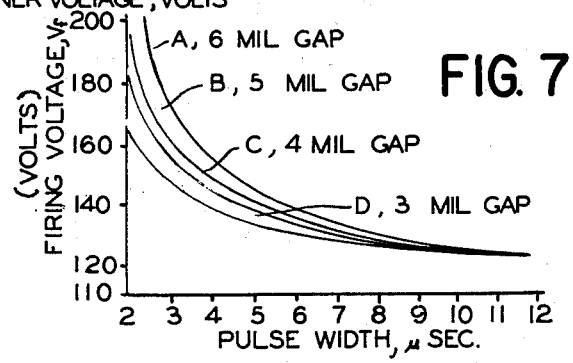
FIG. 7 is a family of firing curves for various gas volume thicknesses showing the effect of pulse width on firing voltage as plots of firing voltage against pulse width.

As is shown in FIG. 7, the firing voltage for a cell is a function of the width of the gas volume between dielectric surfaces 16 and 17 upon which the charged particles collect and the width of the pulse applied to fire the cell. These characteristics plotted as firing voltage vs. pulse width in microseconds show a substantial spacing at pulse widths of 2 microseconds and a convergence at 12 microseconds for the indicated gaps of 6 mils, curve A, 5 mils, curve B, 4 mils, curve C and 3 mils, curve D. A two microsecond firing pulse must be over 200 volts if applied across a 6 mil gap while a 5 mil gap requires about 195 volts, a 4 mil gap requires about 180 volts and a 3 mil gap required about 165 volts. At a 5 microsecond pulse width the firing voltage has converged to a range of about 15 volts from about 155 volts for a 6 mil gap to about 140 volts for a 3 mil gap. Thus in the case of both a sustainer voltage and an addressing voltage a greater certainty of igniting a discharge in a cell is realized if the interval the voltage is applied is extended. Conversely, an extension of the pulse width or interval of application will enable a panel or other device having a multiplicity of cells with a range of gap widths to be operated more reliably and uniformly from cell-to-cell and at a lower firing voltage thereby reducing the number of devices which must be rejected for geometric deviations from cell-to-cell which are out of tolerance.

Figure 5:
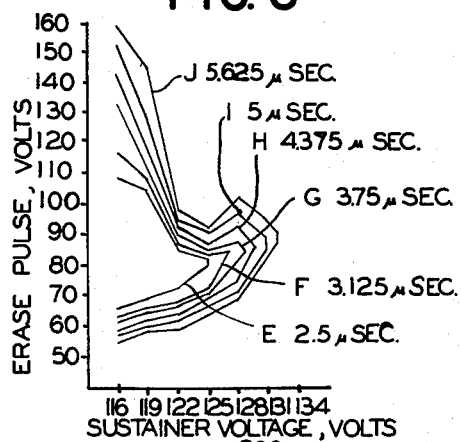
FIG. 5 is a plot of cell erase pulse voltages against various sustainer voltages for a number of delay intervals between the end of the erase signal and the next major sustainer voltage excursion.
Figure 6:
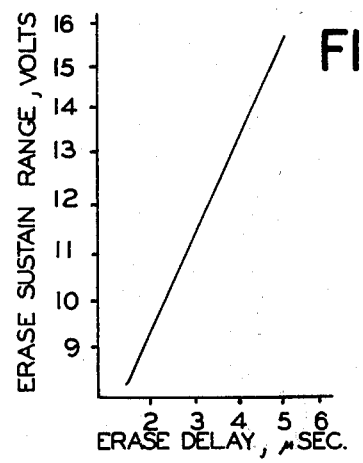
FIG. 6 is a plot of the erase voltage sustain range against erase delay intervals between the end of the erase signal and the next major sustainer voltage excursions.

Erase manipulations of cells have also been observed to depend upon a time function as shown in FIGS. 5 and 6 where the range of erase voltages for various erase delays plotted as erase pulse voltage against sustainer voltage. These curves were developed employing a cell matrix of a 20 cell by 20 cell area made up of orthogonally related straight parallel electrodes each positioned at 33 lines per inch and where the cell has a volume between dielectric layers 16 and 17 of 6.1 mils thickness filed with a neon-argon mixture containing 0.1 percent argon at a pressure of 400 m.m. of Hg. It will be noted that the range of effective erase pulses for a given sustainer voltage increase as the delay from the termination of the pulse to the next major sustainer transition increases. Further, for a given erase pulse voltage, the sustainer voltage range over which that erase pulse is effective is increased with the erase pulse delay. Thus for a 2.5 microsecond delay shown by curve E the range of erase pulse voltages is about 45 volts (between about 63 volts and about 109 volts) for a sustainer voltage of 116 volts and about 15 volts (between about 71 and about 86 volts) for a sustainer voltage of 122 volts, while the range of sustainer voltage tolerable at the optimum erase pulse voltage of about 81 volts is 9 volts. These ranges all increase with increases in the erase delay as for the curve F delay of 3.125 microseconds, curve G delay of 3.75 microseconds, curve H delay of 4.375 microseconds, curve I delay of 5.0 microseconds, and curve J delay of 5.625 microseconds. In the case of curve J the erase pulse can range from about 53 volts to about 160 volts at a sustainer voltage of 116 volts, and from about 59 volts to about 98 volts at a sustainer of 122 volts, while the sustainer range at erase voltages of about 86 to 90 volts is from 116 volts to about 132 volts or about 16 volts.

The erase sustain range voltage is plotted against erase delay in microseconds in FIG. 6 for a typical cell matrix as discussed with respect to FIG. 5 and exhibits an essentially straight line characteristic over the voltage ranges of 9 to 16 volts and delays of 2.5 microseconds to 5.625 microseconds. This illustrates that, as the erase delay increases, the range of operable erase signals increases since all areas beneath the curve in the area to the right are effective for erase functions.

A waveform which permits greater erase delays is thus more forgiving of geometrical variations from cell to cell in a multicell matrix where all cells are required to respond to a given applied sustainer voltage level and a given erase pulse voltage. Increased write time permits a more uniform and lower firing voltage for a matrix of cells having geometry variations from cell to cell to be achieved where the firing voltage is applied for a longer interval.

Sustainer waveforms of the prior art employing regular patterns as typified in FIG. 3 do not permit realization of the optimum timing of write and erase manipulations since equal pedestal intervals are provided in each cycle without regard to the presence or absence of manipulating signals. At acceptable operating frequencies there is insufficient time for use of a wide write pulse or a long erase delay. One limit placed upon a sustainer is the interval the effective voltage at the sustaining level is maintained. As illustrated in FIG. 7, at 5 microseconds, a firing voltage range of about 15 volts exists. While that range if reduced to about 3 volts at 10 microseconds, pulse widths of this magnitude would so slow the operation of conventional multicelled devices, e.g. a 512 by 512 cell matrix panel, as to reduce the utility of those devices to a degree which would render them noncompetitive with alternative display/memories. Accordingly, pulse widths of about 5 microseconds are employed as a suitable compromise.

Write signals follow the characteristics of the sustainer pulses. That is the greater their width, within limits as illustrated, the greater the reliability of response from cell to cell, the greater the tolerance to geometrical variation from cell to cell and the lower the voltage required to operate any cell of the device. In accordance with this invention wider write pulses are accommodated by altering the sustainer waveform to provide a write interval of sufficient length. This is down without sacrificing the sustaining voltage period or interval at its effective sustaining level by maintaining the waveform in a condition to accept write pulses for a longer interval. This is accomplished by employing a waveform which repetitively delays the major transition of the sustainer voltage to the opposite polarity and bunches the next major transition. In the case of a waveform having addressing pedestals the write pedestal is extended in its interval of application and the major transition to the opposite sustainer polarity is delayed for that extension. The sustainer period and thus sustainer frequency can be retained with this modification of waveform by allocating to the addressing pedestal the time formerly available as an addressing pedestal for the opposite polarity.

Figure 4:
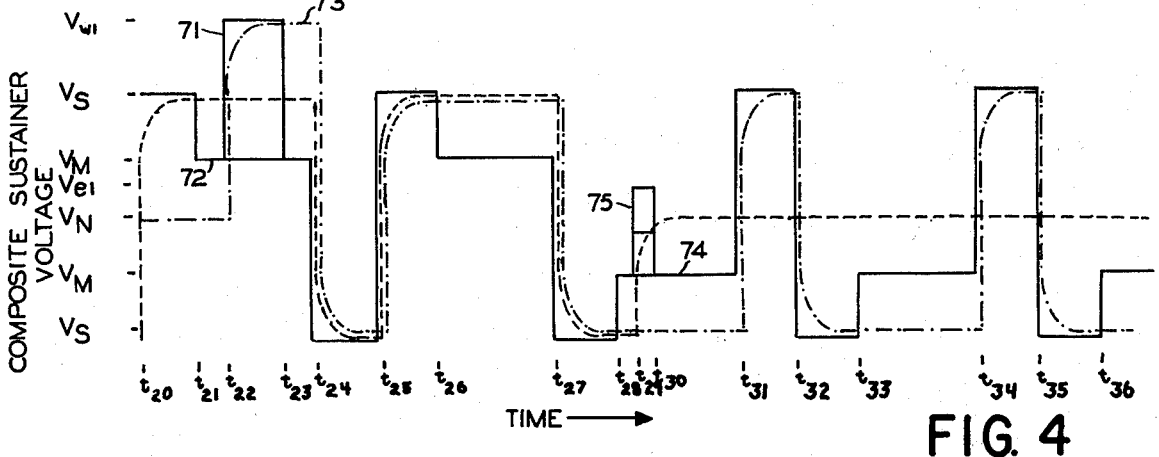
FIG. 4 is a typical plot against time of a sustaining voltage waveform with cell write and cell erase pedestals and appropriate cell addressing signals according to this invention, showing cell wall charge voltages resulting from such signals.

As shown in FIG. 4, the waveform for a write cycle utilizes a quarter cycle for the positive major sustainer pulse at $V_s$ as from $t_{20}$ to $t_{21}$ a half cycle for the write pedestal $V_M$ from $t_{21}$ to $t_{24}$ on the positive side of the neutral axis $V_N$ of the waveform and a quarter cycle from $t_{24}$ to $t_{25}$ for the negative major sustainer pulse $V_s$. When operating at 50 kilohertz this involves 5 microseconds for each major sustainer pulse and 10 microseconds for a write pedestal. Such a 10 microsecond write pedestal readily accommodates a 5 microsecond write pulse between $t_{22}$ and $t_{23}$. The exemplary write pulse is about 210 volts at $V_{w1}$ for sustainer levels discussed above.

It may be noted that if panel displacement currents are excessive a short pedestal at the neutral level can be provided in the region of $t_{24}$ between the write pedestal and the transition to the negative major sustainer pulse and during the transition from negative $V_s$ to positive $V_s$ at $t_{25}$. The write cycle waveform with a long write pedestal can be continued following a write pulse until it is desired to erase one or more cells. When an erase is to be performed, an extended erase interval is provided to afford an opportunity for an extended erase delay. In the case where an erase pedestal is employed for erase signals pulsed in the same direction as write signals, the erase pedestal is of a polarity opposite the write pedestal and is imposed in place of the write pedestal to consume one-half the cycle period. As in the case of a write cycle, once an erase cycle is established it can be continued until a write function is required.

In the erase waveform a narrow pulse width is employed, as between $t_{29}$ and $t_{30}$, usually constrained by the time constants of the pulser circuits and the resultant rise time and fall time of the applied pulses. It is the interval from the fall time $t_{30}$ to the rise of the sustainer in its next major transition $t_{31}$ which is significant in enhancing cell response bandwidth. Since this fall time has a transition interval, for convenience, the erase delay has been measured from the initiation of fall time of an erase pulse to the initiation of the rise time of the next major sustainer transition. The illustrated erase pulse has been idealized to a square pulse of 2.5 microseconds width on a 10 microsecond pedestal extending from $t_{28}$ to $t_{31}$. Its rise at $t_{29}$ is offset from the initiation of the pedestal at $t_{28}$ to represent the delayed rise time and an erase delay of about 6 microseconds is shown. A typical erase volage pulse is about 90 volts for the illustrated sustainer levels.

The sustainer waveforms can be generated by conventional sustainer voltage pull up, pull medium and pull down circuits employing transistors as normally open switches coupling the desired voltages to busses in coupling interface 28 and thence to the respective electrode arrays 11 and 12 via conductors 26-1 . . . 26-n and 27-1 . . . 27-n. The voltage sequences and intervals are established in the control logic 33. When a signal from user interface 32 on path 34 indicates a cell manipulation function to selection logic 31, selection logic indicates the coordinates of the cell or cells to be addressed on paths 39 and 41 to coupling interface 28. Coupling interface directs manipulating signals to the addressed cells on selected leads 26-1 . . . 26-n and 27-1 . . . 27-n. Selection logic 31 also indicates the nature of the manipulting function to control logic 33 via path 61.

Control logic 33 clocks the sustainer voltage 39 and synchronizes the issuance of addressing signals from selection logic to the addressed cells with the sustainer via path 62. In the case where addressing pedestals are employed, this synchronization is with the pedestals. A clocking section 63 in control logic 33 issues pulses at regular intervals. Programmed read only memories 64 and 65 are enabled selectively by a write-erase selecor 66 which indicates which manipulating function is to be performed according to the signal on path 61 from selection logic 31. These read only memories 64 and 65, respectively a write control and an erase control, establish write sustainer cycles, typically the 5 microsecond positive sustainer pulse, the 10 microsecond positive write pedestal and the 5 microsecond negative sustainer pulse by actuating a pull up circuit for one array, e.g. array 11, then a pull medium circuit for that array and then a pull to ground circuit for that array to form the component of the sustainer applicable to array 11. At the time array 11 is pulled to ground, the pull up circuit for array 12 is actuated to produce the negative transition of the composite sustainer. A write control enable signal for the addressing pulser is also issued out of the control logic on path 67 to actuate write pulse 71 as positive and negative going pulses on the coordinates of the addressed cells in arrays 11 and 12 respectively at the appropriate time, as on the pedestal 72 of FIG. 4.

The write pulse 71 while of lower magnitude than pulse 48 of FIG. 3 is effective to initiate a discharge in the addressed cell, raise its wall charge, and raise its wall voltage as at 73. Thereafter the wall charge and wall voltage follow the pattern of other on state cells as they respond to major sustainer voltage transitions.

While a regular symmetrical sustainer as shown in FIG. 3 can be imposed normally and the special write and erase sustainer waveforms imposed only when a write or erase function is dictated by the selection logic, the special waveforms are suitable as sustainers. Accordingly, the preferred embodiment illustrates controls which impose a special waveform at all times. It is convenient to maintain the waveform of the last cell state manipulation. In the example, the write waveform for the sustainer would, therefore, be continued with the sustainer dictated by the repetitive cycling of the progam in the read only memory of write control section 64 of control logic 33. If selection logic indicates a write function, the write control of the sustainer is continued and selection logic 31 issues the addressed write pulses upon coincidence of the appropriate signals from write control 64 clocking section 63 and user interface 32. When an erase function is to be performed, the write-erase selector 66 disables the write control 64 and enables the erase control 65 at the end of a write sustainer cycle, as at $t_{28}$.

In the example, an erase sustainer waveform is a composite of a component waveform on the array 11 and a component waveform on the array 12 both of which result in a shift as a $t_{28}$ so the erase pedestal 74 from $t_{28}$ to $t_{31}$ is of opposite polarity from the write pedestal. At time $t_{28}$ of FIG. 4 the component on array 11 is at ground and that on array 12 shifts from the pull-up level $V_s$ to pull the medium level $V_M$ to establish the pedestal 74. After 10 microseconds, at $t_{31}$, the array 12 is pulled to ground and array 11 is pulled up to $V_s$ where it is maintained for five microseconds, until $t_{32}$. Then the array 11 pull to ground circuit is activated with the array 12 pull-up circuit to pull the composite waveform to $-V_s$. After 5 microseconds, at $t_{33}$, the cycle is repeated by a pull to medium on array 11 and so forth.

Addressing of an erase pulse is by the select logic gated by a coincidence of the erase requirement from user interface 32, a clocking signal on path 62 and an erase control enabling signal on path 68. The programmed length of an erase pulse 75 can be determined in the read only memory of erase control 65 as narrow pulses early in the erase pedestal whereby the advantages of a long erase delay, as between $t_{30}$ and $t_{31}$, are realized. These pulses are positive going on the electrode of array 11 which is addressed and are negative going on the electrode of array 12 for the electrode addressed in that array.

In the above discussion it has been assumed that addressing pulsers have been arranged to pulse array electrodes in the same direction for both erase and write functions. It should be recognized that if more complex address pulser circuitry is employed the pulses could be reversed between a write address and an erase address and that in such a case only a single pedestal would be required. In such instances the sustainer control logic would be simplified at the expense of greater complexity in the selection logic-coupling interface circuitry for addressing individual electrodes. It should also be understood that erasing can be accomplished from a positive pedestal and writing from a negative pedestal by employing composite addressing pulses which are negative. Where partial select levels are low enough to avoid the manipulation of cells not addressed in both arrays, write functions with long write pulse intervals can be imposed on an extended interval of the sustainer at $V_s$ and erase pulses can similarly be imposed with long intervals to provide the advantageous long delay intervals. Another waveform might employ a long interval at the waveform neutral between excursions of the sustainer to the positive and negative $V_s$ values to afford time space for a long interval write pulse and a long interval erase delay. Where other than sharp voltage transitions are employed the duration of the intervals of concern here can be considered to extend between those instants when the critical voltage magnitudes are achieved.

In recapitulation, an advantageous waveform for electronically addressing a multiple cell gas discharge display/memory panel has a regular period in which sustainer voltages which are of comparable positive and negative magnitudes with respect to a neutral voltage level have a first interval of time allotted for a writing function and a second interval of time allotted for an erasing function. The first or second intervals are selectively actuated, depending on the addressing function to be performed, so that one or the other is imposed for a preponderance of the allotted time. Preferably the selected function is imposed for all of the allotted time. Thus, for example, in the simplified waveform a relatively high sustainer voltage can be imposed for about one quarter of the period of the cycle, a relatively low sustainer voltage can be imposed for about one-quarter of the period of the cycle and an addressing function can be imposed for about one-half the period of the cycle. Voltage levels intermediate the sustainer voltage levels and the neutral level are imposed on the panel during the addressing function intervals. When the addressing function is a write function, its signal level can be a voltage level which is augmented by the voltage applied to addressed cells by address pulser signals to a level exceeding the sustainer voltage, whereas an erase function signal level can be a voltage which when algebraically summed with the address pulser signals applied to addressed cells imposes a level on those addressed cells closer to the neutral voltage level than the intermediate voltage level.

Device geometry and component composition, particularly dielectric thickness between the electrodes and the gas, gas composition and gas pressure all modify the effects of extending the addressing interval, the write pulse duration, and the erase delay. However, the general advantages noted attach to devices with different geometries and compositions. It should also be noted that the waveforms described are only approximate and may be modified to suit a particular set of electronics and provide small amounts of time for diode recovery or other factors.

Since it is evident from the above that many waveforms can be produced to achieve the advantages of an extended duration of a write pulse or an erase delay and that many forms of programmers and controls can be employed to generate waveforms which will accommodate these features, it is to be understood that the above description is merely descriptive and is not to be read as limiting the cope of this invention.

We claim:

1. In a process for operating a multiple cell gas discharge display/memory panel including the steps of cyclically subjecting said cells to first and second sustaining voltage levels on opposite sides of a neutral voltage level with cycles which are contiguous in time and of a uniform time period and electronically addressing cells within said panel to alter their state of discharge by subjecting said cells to voltage levels intermediate the sustaining voltage levels and said neutral voltage level within a uniform time period of a sustaining voltage cycle, the improvement which comprises: selectively establishing a voltage level intermediate the sustaining voltage level and said neutral voltage level and of a selected polarity relative to said neutral voltage level for a time interval which is a preponderance of the time allotted for addressing within said uniform time period of a sustaining voltage cycle; and selectively imposing a voltage on a cell to address said cell during said time interval which is cumulative with said selectively established intermediate voltage level to alter the discharge state of said cell.

2. A process according to claim 1 wherein the preponderance of the allotted time is the entire allotted time for addressing.

3. In a process according to claim 1 wherein the addressing is a writing function and the selectively imposed voltage is arithmetically cumulative with an intermediate voltage level to impose a voltage deviation from said neutral voltage level greater than the sustaining voltage level.

4. In a process according to claim 3 wherein said selectively imposed voltage is imposed for a time interval of a duration approaching the duration of the writing function interval.

5. In a process according to claim 1 wherein the addressing is an erasing function and the selectively imposed voltage is algebraically cumulative with an intermediate voltage level to impose a voltage closer to the neutral voltage level than said intermediate voltage.

6. In a process according to claim 5 wherein said selectively imposed voltage is imposed for a time interval of short time duration relative to the erasing function interval.

7. A process according to claim 6 wherein the erasing signal is imposed in the first portion of the erasing function interval.

8. A process according to claim 1 wherein the time interval of each cycle in which the panel is subjected to sustaining voltage levels and the time interval of each cycle in which the intermediate voltage level is imposed are of about equal magnitude.

9. A process according to claim 9 wherein a sustaining voltage level, positive with respect to the neutral voltage level is imposed for about one quarter of a cycle time interval, a sustaining voltage level negative with respect to the neutral voltage level is imposed for about one quarter of a cycle time interval, and an intermediate voltage level is imposed for about one half of a cycle time interval.

10. The method of operating a multicelled gas discharge display/memory device, said cells each comprising an electrode portion in a first electrode array common to a plurality of cells, an electrode portion in a second electrode array spaced from the electrode portion of said first array, a volume of ionizable gas in the vicinity of the respective electrode portions of the first and second array for the cell, and at least one dielectric layer separating one of the electrode portions from the gas volume, the cells having the characteristic that individual cells are sustained in their on state or off state of discharge when subjected to a sustainer voltage between respective electrodes of the first and second array which is periodically alternating between sustainer magnitudes on opposite sides of a neutral voltage including the steps of:

repetitively imposing a sustainer voltage cycle having uniform time periods which aare contiguous in time;

applying within each of said cycles a first voltage of a sustainer magnitude between the first and second arrays for a first interval of time; and applying within at least one of said cycles a second voltage between the first and second array for a second interval of time which is of greater duration than said first interval of time, the second voltage being of a polarity opposite the polarity of the first voltage and of a magnitude from which discharge state manipulating signals individual to the respective electrodes of a cell are effective to shift the state of discharge of the cell between an on state and an off state, said second interval occurring between successive applications of said first voltage.

11. The method according to claim 10 including the step of applying within each of said cycles a third voltage between the first and second arrays for a third interval of time less than the second interval of time, the third voltage being of the polarity of the second voltage and of a magnitude greater than the second voltage.

12. The method according to claim 11 wherein the third voltage magnitude is the sustainer magnitude.

13. The method according to claim 12 wherein the duration of the third interval of time is essentially equal to the duration of the first interval of time.

14. The method according to claim 10 wherein the first interval of time is of about 5 microseconds duration and the second interval of time is about 10 microseconds duration.

15. The method according to claim 12 wherein the first and third intervals of time are of about 5 microseconds duration and the second interval of time is about 10 microseconds duration.

16. The method according to claim 10 including the step of applying a cell discharge state manipulating signal to the respective electrodes of the first and second array for a selected cell during the application of the second voltage.

17. The method according to claim 16 wherein the applied manipulating signal is in a direction to augment the second voltage to impose on the selected cell a voltage establishing an on state wall charge in the selected cell.

18. The method according to claim 17 wherein the manipulating signal is applied for an interval of time of about the magnitude of the first interval of time.

19. The method according to claim 16 wherein the applied manipulating signal is in a direction to oppose the second voltage to impose on the selected cell a voltage establishing an off state wall charge in the selected cell.

20. The method according to claim 19 wherein the manipulating signal is applied early in the second interval of time for an interval of time which is short compared to the first interval of time.

21. The method according to claim 20 wherein a delay interval of at least the duration of the first interval of time occurs between the effective end of the manipulating signal and the next succeeding application of the first voltage.

22. The method according to claim 11 including the steps of selectively terminating application of the second voltage; and selectively applying within at least one of said cycles a fourth voltage between the first and second arrays for a fourth interval of time greater than the first or third intervals of time, the fourth voltage being of the polarity of the first voltage and of a magnitude less than the first voltage.

23. The method according to claim 22 wherein said second interval of time and said fouth interval of time are of the same duration.

24. The method according to claim 22 including the steps of selecting a cell for transfer from an off state to an on state of discharge; terminating the application of the second voltage and applying the fourth voltage in response to said selection; and applying a write signal to the selected cell during the fourth interval of time in response to said selection, said write signal being of a magnitude to augment the fourth voltage to impose on the selected cell a voltage establishing an on state wall charge in the selected cell.

25. The method according to claim 24 wherein the write signal is applied for an interval of time of about the same duration as the first interval of time.

26. The method according to claim 22 including the steps of selecting a cell for transfer from an on state to an off state of discharge; maintaining application of the second voltage for the second interval of time; inhibiting application of the fourth voltage for the fourth interval of time; and applying an erase signal to the selected cell during the second time interval in response to said selection, said erase signal being of a magnitude to reduce the second voltage to impose on the selected cell a voltage sufficient to institute a discharge and to establish an off state wall charge in the selected cell.

27. The method according to claim 26 wherein the erase signal is of short duration relative to the first interval of time and is applied during the initial portion of the second interval of time.

28. The method according to claim 27 wherein the interval of time from the effective end of the erase signal to the effective initiation of the third voltage is at least about the duration of the first interval of time.

29. In an operating system for a multicelled gas discharge display/memory device said device comprising a first array of electrodes, a second array of electrodes, said electrodes of said first and second arrays having respective spaced portions for each cell, an ionizable gas volume between the spaced electrode portions of each cell, and a dielectric layer between at least one electrode portion of each cell and the gas volume of each cell; a sustainer voltage generator connected across each cell to cyclically impose an alternating voltage having uniform periods of time which are contiguous in time; and means for manipulating the discharge state of individual cells between an on state and an off state, the improvement comprising: means to apply during each of said uniform periods a first sustainer voltage of a first polarity relative to a neutral voltage for the device across each cell; means to apply during each of said uniform periods a second sustainer voltage of a second polarity relative to a neutral voltage for the device across each cell; clocking means to maintain said first voltage at least at an effective sustainer voltage level during each sustainer period for at least a first time intervalsufficient to maintain a discharge in any cell in said device upon transition from said second voltage when said cell is in the on state during application of said second voltage; clocking means to maintain said second voltage at least at an effective sustainer voltage level during each sustainer period for at least a second time interval sufficient to maintain a discharge in any cell in said device upon transition from said first voltage when said cell is in the on state during application of said first voltage; clocking means to make a rapid transition between said first effective sustainer voltage and said second effective sustainer voltage during each sustainer period; and means to apply an addressing pedestal voltage intermediate one of said first and second sustainer voltage levels and said neutral voltage between application of said first effective sustainer voltage and application of said second effective sustainer voltage for a third interval of a duration of the order of one half said sustainer period during each sustainer period.

30. In a system according to claim 29 the improvement comprising: means to apply an addressing pedestal voltage intermediate said first and second sustainer voltage levels during at least a portion of said third time interval.

31. In a system according to claim 29 the improvement comprising: means to selectively designate a write mode for manipulation of a cell from the off state to the on state; means responsive to said designating means to control said addressing pedestal means to a write pedestal voltage; and means to actuate one of said individual cell manipulating means to impose a write voltage pulse on its respective cell to transfer said cell from an off state to an on state during application of said write pedestal voltage.

32. A system according to claim 31 wherein the individual cell manipulating means imposes an effective write voltage pulse for a time interval of a duration of at least about the first time interval.

33. In a system according to claim 29 the improvement comprising: means to selectively designate an erase mode for manipulation of a cell from the on state to the off state; means responsive to said designating means to control said addressing pedestal means to an erase pedestal voltage; and means to actuate one of said individual cell manipulating means to impose an erase voltage pulse on its respective cell for transfer said cell from an on state to an off state during application of said erase pedestal voltage.

34. A system according to claim 33 wherein the individual cell manipulating means imposes an effective erase voltage pulse for a time interval which is short relative to the first time interval.

35. A system according to claim 34 wherein the individual cell manipulating means terminates the effective erase voltage pulse an interval preceding the delayed transition in said third time interval which is at least about the duration of the first time interval.

* * * * *